(12) United States Patent
Haba et al.

(10) Patent No.: US 12,543,577 B2
(45) Date of Patent: Feb. 3, 2026

(54) BONDED STRUCTURE WITH ACTIVE INTERPOSER

(71) Applicant: ADEIA SEMICONDUCTOR BONDING TECHNOLOGIES INC., San Jose, CA (US)

(72) Inventors: Belgacem Haba, Saratoga, CA (US); Laura Wills Mirkarimi, Sunol, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 449 days.

(21) Appl. No.: 17/934,514

(22) Filed: Sep. 22, 2022

(65) Prior Publication Data

US 2023/0100032 A1 Mar. 30, 2023

Related U.S. Application Data

(60) Provisional application No. 63/248,311, filed on Sep. 24, 2021.

(51) Int. Cl.
H01L 23/538 (2006.01)
H01L 23/00 (2006.01)
(Continued)

(52) U.S. Cl.
CPC ........ *H01L 23/5382* (2013.01); *H01L 23/481* (2013.01); *H01L 23/5386* (2013.01);
(Continued)

(58) Field of Classification Search
CPC . H01L 23/5382; H01L 23/5386; H01L 24/08; H01L 2224/08121;
(Continued)

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

JP 2013-033786 A 2/2013
JP 2018-160519 10/2018
(Continued)

OTHER PUBLICATIONS

International Search Report and Written Opinion mailed Jan. 18, 2023, International Application No. PCT/US2022/076881, 14 pages.
(Continued)

*Primary Examiner* — Mamadou L Diallo
(74) *Attorney, Agent, or Firm* — Knobbe, Martens, Olson & Bear, LLP

(57) ABSTRACT

A bonded structure is disclosed. The bonded structure can comprise a first semiconductor element having a first contact pad. An interposer can include a second contact pad on a first side of the interposer and a third contact pad and a fourth contact pad on a second side of the interposer opposite the first side, the second contact pad bonded to the first contact pad; a second semiconductor element having a fifth contact pad bonded to the third contact pad and a sixth contact pad bonded to the fourth contact pad. A switching circuitry can be configured to switch between a first electrical connection between the second and third contact pads and a second electrical connection between the second and fourth contact pads.

29 Claims, 11 Drawing Sheets

(51) Int. Cl.
*H01L 23/48* (2006.01)
*H01L 25/065* (2023.01)

(52) U.S. Cl.
CPC ............ *H01L 24/08* (2013.01); *H01L 24/80* (2013.01); *H01L 25/0657* (2013.01); *H01L 2224/08121* (2013.01); *H01L 2224/08145* (2013.01); *H01L 2224/08225* (2013.01); *H01L 2224/80895* (2013.01); *H01L 2224/80896* (2013.01); *H01L 2225/06527* (2013.01); *H01L 2225/06544* (2013.01); *H01L 2225/06562* (2013.01); *H01L 2225/06593* (2013.01); *H01L 2225/06596* (2013.01); *H01L 2924/381* (2013.01)

(58) Field of Classification Search
CPC . H01L 2224/80895; H01L 2224/80896; H01L 24/05; H01L 24/06; H01L 24/09; H01L 25/0657; H01L 2224/08145; H01L 2224/08225; H01L 2225/06527; H01L 2225/06544; H01L 2225/06562
See application file for complete search history.

(56) References Cited

U.S. PATENT DOCUMENTS

| | | |
|---|---|---|
| 6,080,640 A | 6/2000 | Gardner et al. |
| 6,255,899 B1 | 7/2001 | Bertin et al. |
| 6,423,640 B1 | 7/2002 | Lee et al. |
| 6,465,892 B1 | 10/2002 | Suga |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,105,980 B2 | 9/2006 | Abbott et al. |
| 7,193,423 B1 | 3/2007 | Dalton et al. |
| 7,385,283 B2 | 6/2008 | Wu et al. |
| 7,750,488 B2 | 7/2010 | Patti et al. |
| 7,803,693 B2 | 9/2010 | Trezza |
| 8,183,127 B2 | 5/2012 | Patti et al. |
| 8,259,461 B2 | 9/2012 | Hollis |
| 8,349,635 B1 | 1/2013 | Gan et al. |
| 8,377,798 B2 | 2/2013 | Peng et al. |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 9,064,862 B2 | 6/2015 | Hwang et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,385,024 B2 | 7/2016 | Tong et al. |
| 9,394,161 B2 | 7/2016 | Cheng et al. |
| 9,401,312 B1 | 7/2016 | Kannan et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,748,206 B1 | 8/2017 | Huang et al. |
| 9,799,587 B2 | 10/2017 | Fujii et al. |
| 9,852,988 B2 | 12/2017 | Enquist et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,707,087 B2 | 7/2020 | Uzoh et al. |
| 10,727,219 B2 | 7/2020 | Uzoh et al. |
| 10,784,191 B2 | 9/2020 | Huang et al. |
| 10,790,262 B2 | 9/2020 | Uzoh et al. |
| 10,797,037 B1 | 10/2020 | Lin |
| 10,804,255 B1 | 10/2020 | Agarwal et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,367,652 B2 | 6/2022 | Uzoh et al. |
| 11,380,597 B2 | 7/2022 | Katkar et al. |
| 11,721,653 B2 | 8/2023 | DeLaCruz et al. |
| 11,842,894 B2 | 12/2023 | Katkar et al. |
| 12,046,583 B2 | 7/2024 | Katkar et al. |
| 12,218,107 B2 | 2/2025 | Katkar et al. |
| 12,308,332 B2 | 5/2025 | DeLaCruz et al. |
| 2004/0084414 A1 | 5/2004 | Sakai et al. |
| 2005/0184398 A1 | 8/2005 | Zhou et al. |
| 2006/0057945 A1 | 3/2006 | Hsu et al. |
| 2006/0267221 A1 | 11/2006 | Allen |
| 2007/0111386 A1 | 5/2007 | Kim et al. |
| 2011/0050320 A1 | 3/2011 | Gillingham |

(56) References Cited

U.S. PATENT DOCUMENTS

| | | |
|---|---|---|
| 2011/0292708 A1 | 12/2011 | Kang et al. |
| 2011/0316572 A1 | 12/2011 | Rahman |
| 2013/0214410 A1* | 8/2013 | Khan ............... H01L 23/49833 |
| | | 257/738 |
| 2014/0175655 A1 | 6/2014 | Chen et al. |
| 2014/0293705 A1 | 10/2014 | Gillingham |
| 2015/0064498 A1 | 3/2015 | Tong |
| 2015/0085195 A1 | 3/2015 | Pereira et al. |
| 2015/0206824 A1 | 7/2015 | Ramachandra et al. |
| 2015/0243611 A1 | 8/2015 | Liu et al. |
| 2015/0333056 A1 | 11/2015 | Du et al. |
| 2015/0346279 A1 | 12/2015 | Douskey et al. |
| 2015/0380341 A1 | 12/2015 | Chiou et al. |
| 2016/0005716 A1* | 1/2016 | Yu ..................... H01L 23/49811 |
| | | 257/738 |
| 2016/0118095 A1 | 4/2016 | Pelley et al. |
| 2016/0181228 A1 | 6/2016 | Higuchi et al. |
| 2016/0343682 A1 | 11/2016 | Kawasaki |
| 2017/0069593 A1 | 3/2017 | Chou et al. |
| 2017/0125383 A1 | 5/2017 | Liu |
| 2017/0250160 A1 | 8/2017 | Wu et al. |
| 2018/0012868 A1 | 1/2018 | Wu et al. |
| 2018/0040547 A1* | 2/2018 | Zuo ........................ H10D 1/68 |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0323177 A1 | 11/2018 | Yu et al. |
| 2018/0323227 A1 | 11/2018 | Zhang et al. |
| 2018/0323952 A1 | 11/2018 | Chang et al. |
| 2018/0331066 A1 | 11/2018 | Uzoh et al. |
| 2019/0013295 A1 | 1/2019 | Wu et al. |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0157333 A1 | 5/2019 | Tsai et al. |
| 2019/0253056 A1 | 8/2019 | Lin et al. |
| 2019/0265411 A1 | 8/2019 | Huang et al. |
| 2019/0333550 A1 | 10/2019 | Fisch |
| 2019/0385935 A1 | 12/2019 | Gao et al. |
| 2019/0385966 A1 | 12/2019 | Gao et al. |
| 2019/0385982 A1 | 12/2019 | Lee et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0035643 A1 | 1/2020 | Hirata et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0279821 A1 | 9/2020 | Haba et al. |
| 2020/0286875 A1 | 9/2020 | Nishida et al. |
| 2020/0294908 A1 | 9/2020 | Haba et al. |
| 2020/0294918 A1 | 9/2020 | Nishida et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0395339 A1 | 12/2020 | Chen et al. |
| 2020/0402959 A1 | 12/2020 | Eom et al. |
| 2020/0411483 A1 | 12/2020 | Uzoh et al. |
| 2021/0020601 A1 | 1/2021 | Chen et al. |
| 2021/0035943 A1* | 2/2021 | Ramm ............... H01L 21/4853 |
| 2021/0082865 A1 | 3/2021 | Baraskar et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0143921 A1 | 5/2021 | Nasrullah et al. |
| 2021/0181510 A1 | 6/2021 | Katkar et al. |
| 2021/0193603 A1 | 6/2021 | DeLaCruz et al. |
| 2021/0193624 A1 | 6/2021 | DeLaCruz et al. |
| 2021/0193625 A1 | 6/2021 | Katkar et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0384133 A1* | 12/2021 | Ong ................... H01L 23/49838 |
| 2021/0407941 A1 | 12/2021 | Haba |
| 2022/0020741 A1 | 1/2022 | DeLaCruz et al. |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0075833 A1* | 3/2023 | Choi ..................... H01L 23/552 |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2023/0395544 A1 | 12/2023 | DeLaCruz et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0162178 A1 | 5/2024 | DeLaCruz et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |

(56) References Cited

U.S. PATENT DOCUMENTS

| | | |
|---|---|---|
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |
| 2025/0096191 A1 | 3/2025 | Gao et al. |
| 2025/0112123 A1 | 4/2025 | Katkar et al. |
| 2025/0185163 A1 | 6/2025 | Zhao et al. |
| 2025/0210585 A1 | 6/2025 | Fountain, Jr. et al. |
| 2025/0212554 A1 | 6/2025 | Katkar et al. |
| 2025/0218903 A1 | 7/2025 | Uzoh et al. |

FOREIGN PATENT DOCUMENTS

| | | |
|---|---|---|
| KR | 20190059857 A | 5/2019 |
| KR | 20190122794 A | 10/2019 |
| WO | WO 2005/043584 A2 | 5/2005 |
| WO | WO 2021/133671 A1 | 7/2021 |

OTHER PUBLICATIONS

Peters, Laura, "The Path To Known Good Interconnects," semiengineering.com/the-path-to-known-good-interconnects, Jan. 19, 2023, 13 pages (printed Jan. 24, 2023).

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences—Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Plobi, A. et al., "Wafer direct bonding: tailoring adhesion between brittle materials," Materials Science and Engineering Review Journal, 1999, R25, 88 pages.

Calderoni, Alessandro, "Memory Devices and Selectors for High-Density Memory Technology," International Electron Devices Meeting, Short Course 2: Technologies for Memory-Centric Computing, Dec. 8, 2019, 330 pages.

Derbyshire, Katherine, "The Darker Side of Hybrid Bonding," Semiconductor Engineering, Dec. 17, 2020, 6 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

ONSEMI AR0820 image, cross section of a CMOS image sensor product. The part in the image was shipped on Sep. 16, 2021. Applicant makes No. representation that the part in the image is identical to the part identified in the separately submitted reference Bush, Nov. 8, 2018, ElectronicsWeekly.com ("BUSH article"); however, the imaged part and the part shown in the Bush article share the part number "ONSEMI AR0820.".

Sohail O., "Sony has released the Smartphone Industry's first 48MP Sensor that goes beyond recording 4K Footage at 60FPS". Release of IMX586; Jul. 23, 2018, downloaded from https://wccftech.com/sony-releases-48mp-smartphone-sensor/ on May 3, 2024, 4 pages.

Sony IMX260 images, showing various cross sections and materials analyses for a hybrid bonded back side illuminated CMOS image sensor. The part in the images was shipped in Apr. 2016. Applicant makes No. representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image." (8 pages).

Bush, Steve, "Electronica: Automotive power modules from On Semi," ElectronicsWeekly.com, indicating AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023) ("Bush article").

European Partial Search Report dated Jul. 23, 2025, Application No. 22873869.6, 15 pages.

Lee, Hsien-Hsin, "Test Challenges for 3D Integrated Circuits," IEEE Design & Test of Computers, Sep./Oct. 2009.

* cited by examiner

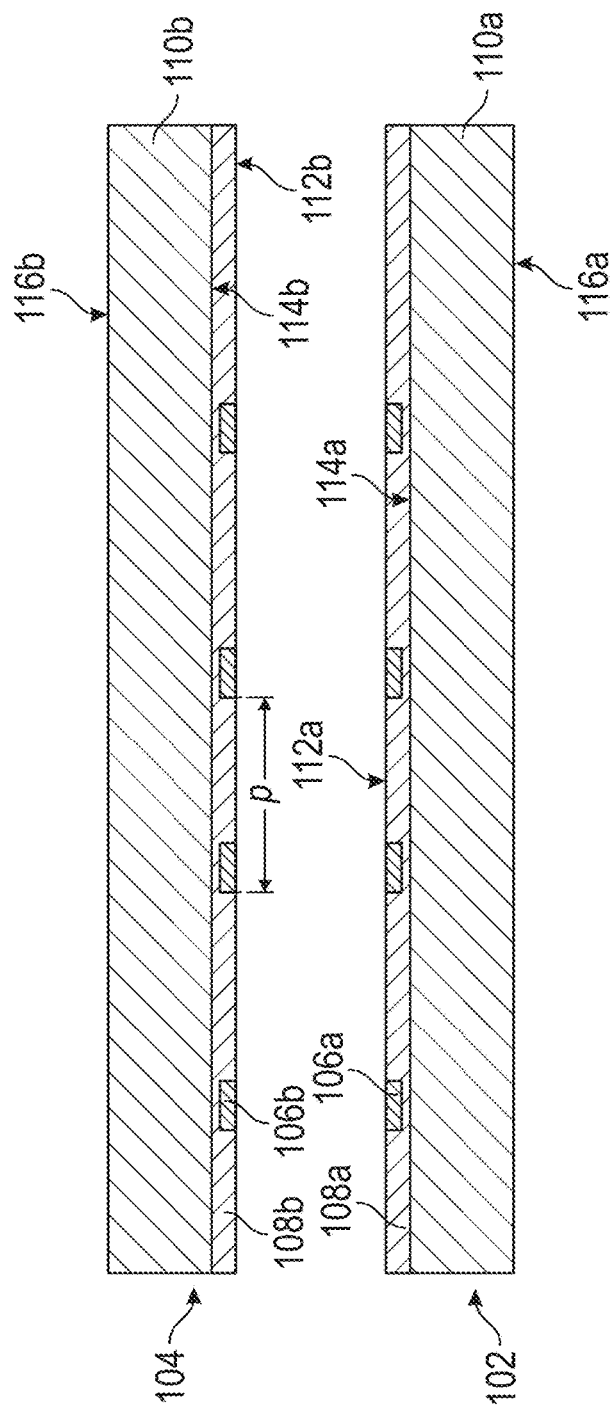
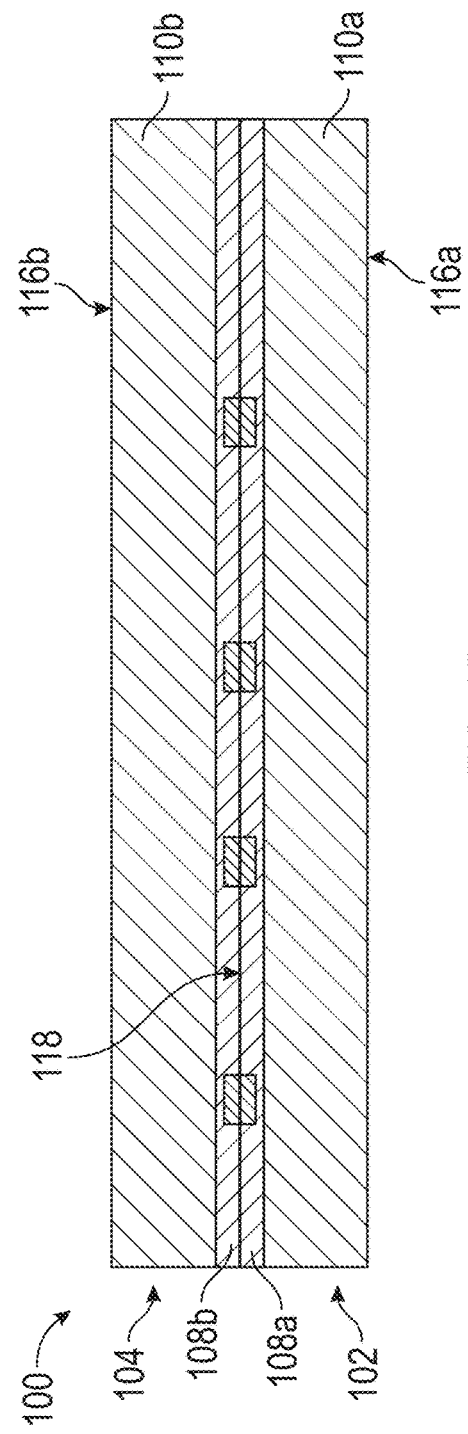

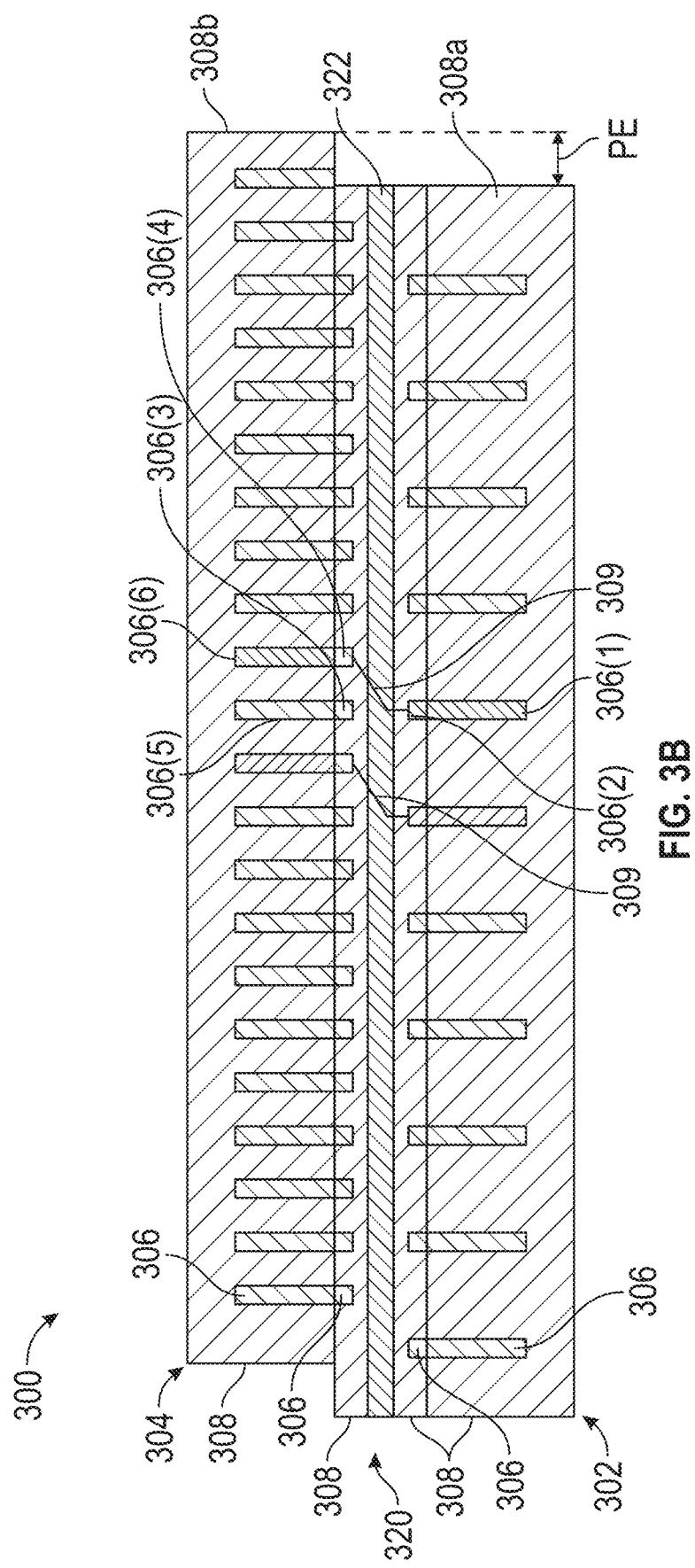

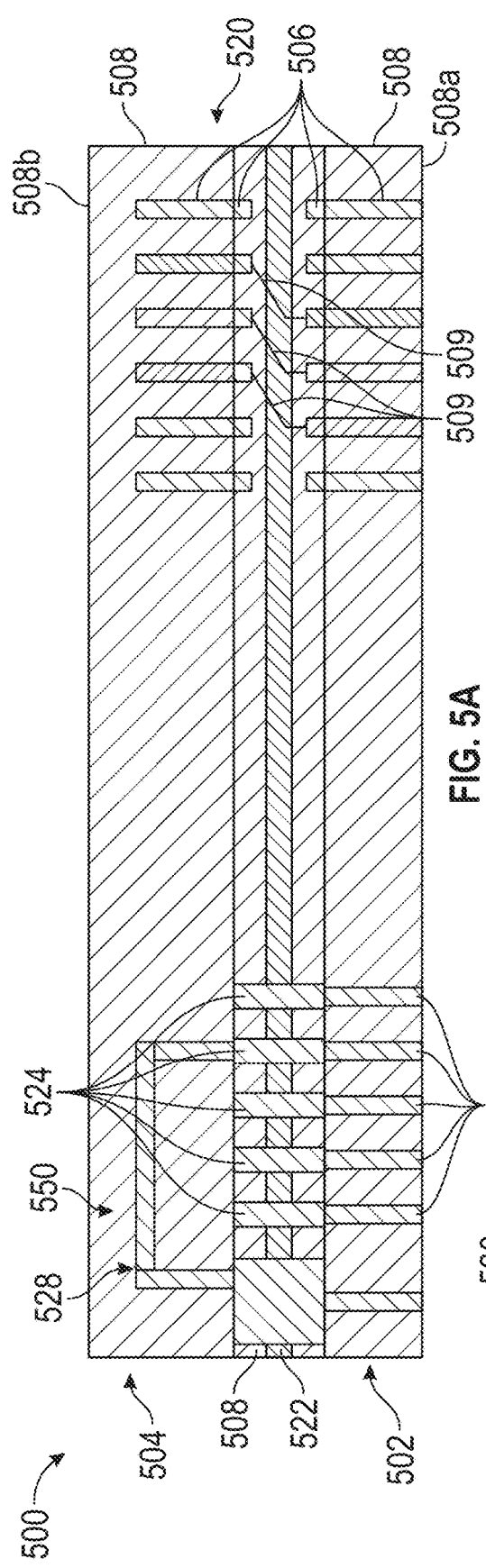
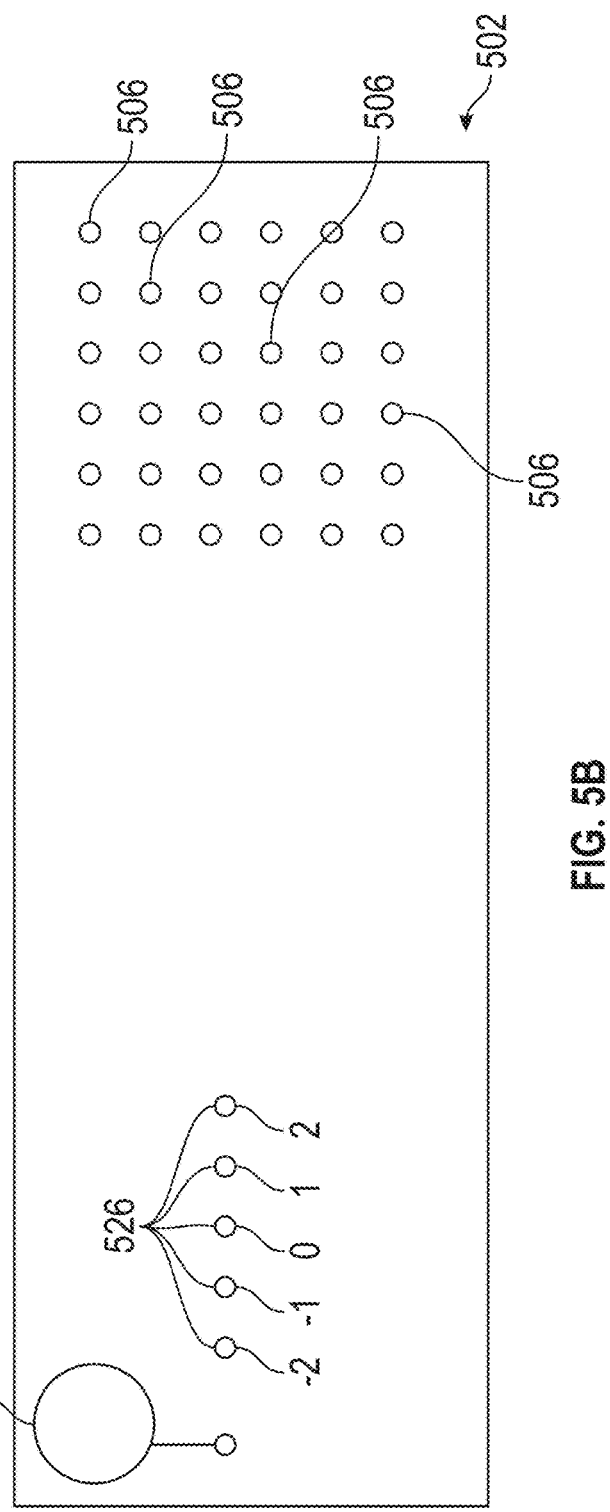
FIG. 5A
FIG. 5B

BONDED STRUCTURE WITH ACTIVE INTERPOSER

RELATED APPLICATIONS

This application claims the priority benefit of U.S. Provisional Patent Application 63/248,311 filed on Sep. 24, 2021, entitled "BONDED STRUCTURE WITH ACTIVE INTERPOSER," which is incorporated by reference herein in its entirety.

BACKGROUND

Field

The field relates to a bonded structure with an active interposer.

Description of the Related Art

Multiple semiconductor elements (such as integrated device dies) may be stacked on top of one another in various applications, such as high bandwidth memory (HBM) devices or other devices that utilize vertical integration. The stacked elements can electrically communicate with one another through arrays of contact pads. It can be important to ensure contact pads on opposing semiconductor elements are aligned and that the electrical connections between contact pads on the two opposing semiconductor elements are reliable.

SUMMARY OF THE INVENTION

In one embodiment, a bonded structure can include a first semiconductor element having a first contact pad; an interposer having a second contact pad on a first side of the interposer and a third contact pad and a fourth contact pad on a second side of the interposer opposite the first side, the second contact pad bonded to the first contact pad; a second semiconductor element having a fifth contact pad bonded to the third contact pad and a sixth contact pad bonded to the fourth contact pad; and switching circuitry configured to switch between a first electrical connection between the second and third contact pads and a second electrical connection between the second and fourth contact pads.

In some embodiments, the switching circuitry is disposed in the interposer. In some embodiments, the switching circuitry is disposed in at least one of the first semiconductor element and the second semiconductor element. In some embodiments, the second and third contact pads are laterally offset from one another. In some embodiments the first semiconductor element includes a first plurality of contact pads including the first contact pad, and the second semiconductor element includes a second plurality of contact pads including the fifth and sixth contact pads, the first plurality of contact pads having a first pitch that matches a second pitch of the second plurality of contact pads. In some embodiments, the first semiconductor element includes a first plurality of contact pads including the first contact pad, and wherein the second semiconductor element includes a second plurality of contact pads including the fifth and sixth contact pads, the first plurality of contact pads having a first pitch that is different from a second pitch of the second plurality of contact pads. In some embodiments, the interposer includes a third plurality of contact pads on the second side, the third plurality of contact pads including a set of contact pads each connectable to the second contact pad on the first side by way of the switching circuitry, the set of contact pads comprising the third contact pad, the fourth contact pad, and one or more additional contact pads.

In some embodiments, the set of contact pads are disposed within an area no more than 100 µm². In some embodiments, the set of contact pads are disposed within an area no more than 10 µm². In some embodiments, the set of contact pads are disposed within an area no more than 1 µm².

In some embodiments, the bonded structure includes testing circuitry configured to determine a bonding offset between the first and second semiconductor elements. In some embodiments, the testing circuitry is configured to transmit a signal to the switching circuitry indicative of the bonding offset. In some embodiments, the switching circuitry is programmed to form the first electrical connection or the second electrical connection based at least in part on the determined bonding offset. In some embodiments, the testing circuitry includes a plurality of test pads in the first semiconductor element, a plurality of vias in the interposer that are bonded to the first plurality of test pads, and a probe pad in the second semiconductor element bonded to a first via of the plurality of vias. In some embodiments, the plurality of test pads includes a two-dimensional array of test pads, and wherein the plurality of vias includes a two-dimensional array of vias. In some embodiments, the testing circuitry further includes a reference pad connected to the probe pad, the signal transmitted to the switching circuitry based at least in part on a determining a continuity of the signal between the probe pad and the reference pad. In some embodiments, the second pad is directly bonded to the first pad without an intervening adhesive, and wherein the fifth pad is directly bonded to the third pad without an intervening adhesive.

In some embodiments, the first semiconductor element includes a first nonconductive field region in which the first contact pad is at least partially embedded, wherein the first side of the interposer includes a second nonconductive field region in which the second contact pad is at least partially embedded, the first and second nonconductive field regions directly bonded to one another without an intervening adhesive. In some embodiments, the second side of the interposer includes a third nonconductive field region in which the third and fourth contact pads are at least partially embedded, wherein the second semiconductor element comprises a fourth nonconductive field region in which the fifth and sixth contact pads are at least partially embedded, the third and fourth nonconductive field regions directly bonded to one another without an intervening adhesive.

In some embodiments, the switching circuitry includes a multi-bit switch multiplexer. In some embodiments, the switching circuitry includes a plurality of switches that can electrically connect a plurality of contact pads on the first side of the interposer, including the second contact pad, to the third contact pad on the second side of the interposer. In some embodiments, a diameter of the first contact pad is different from a diameter of the second contact pad. In some embodiments, the diameter of the first contact pad is smaller than the diameter of the second contact pad, the bonded structure further including a plurality of contact pads in the first semiconductor element, the plurality of contact pads including the first contact pad and at least one additional contact pad, the plurality of contact pads bonded to the second contact pad. In some embodiments, the diameter of the first contact pad is larger than the diameter of the second contact pad, the bonded structure further including a plurality of contact pads in the first side of the interposer, the plurality of contact pads including the second contact pad and at least one additional contact pad, the plurality of contact pads bonded to the first contact pad.

In another embodiment a bonded structure can include: a first semiconductor element; an interposer having a first plurality of contact pads on a first side of the interposer and a second plurality of contact pads on a second side of the interposer opposite the first side, the first side of the interposer bonded to the first semiconductor element, the first plurality of contact pads electrically connected to the first semiconductor element; a second semiconductor element bonded to the second side of the interposer, the second plurality of contact pads electrically connected to the second semiconductor element; and switching circuitry configured to switch electrical connections between each contact pad of the first plurality of contact pads and a set of multiple contact pads of the second plurality of contact pads.

In some embodiments, the switching circuitry is configured to switch electrical connections between each contact pad of the second plurality of contact pads and a second set of multiple contact pads of the first plurality of contact pads. In some embodiments, the switching circuitry is disposed in the interposer. In some embodiments, the switching circuitry is disposed in at least one of the first semiconductor element and the second semiconductor element. In some embodiments, the first semiconductor element includes a third plurality of contact pads directly bonded to the first plurality of contact pads without an intervening adhesive, and wherein the second semiconductor element includes a fourth plurality of contact pads directly bonded to the second plurality of contact pads without and intervening adhesive. In some embodiments, the first semiconductor element includes a first nonconductive field region in which the third plurality of contact pads are at least partially disposed, wherein the first side of the interposer includes a second nonconductive field region in which the first plurality of contact pads are at least partially disposed, and wherein the first and second nonconductive field regions are directly bonded without an adhesive. In some embodiments, the second side of the interposer includes a third nonconductive field region in which the second plurality of contact pads are at least partially disposed, wherein the second semiconductor element includes a fourth nonconductive field region in which the fourth plurality of contact pads are at least partially disposed, and wherein the third and fourth nonconductive field regions are directly bonded without an adhesive. In some embodiments, a first contact pad of the first plurality of contact pads is directly bonded to a second contact pad of the third plurality of contact pads, a diameter of the first contact pad being different from a diameter of the second contact pad. In some embodiments, the diameter of the first contact pad is smaller than the diameter of the second contact pad, the second contact pad being directly bonded to the first contact pad and at least one additional contact pad. In some embodiments, the diameter of the first contact pad is larger than the diameter of the second contact pad, the first contact pad being directly bonded to the second contact pad and at least one additional contact pad. In some embodiments, the first plurality of contact pads has a pitch that matches a pitch of the second plurality of contact pads. In some embodiments, the first plurality of contact pads has a pitch that is different from a pitch of the second plurality of contact pads. In some embodiments, the set of contact pads are disposed within an area no more than 100 $\mu m^2$. In some embodiments, the set of contact pads are disposed within an area no more than 10 $\mu m^2$. In some embodiments, the set of contact pads are disposed within an area no more than 1 $\mu m^2$.

In some embodiments, the bonded structure further includes testing circuitry configured to determine a bonding offset between the first and second semiconductor elements and to transmit a signal to the switching circuitry indicative of the bonding offset. In some embodiments, the testing circuitry includes a plurality of test pads in the first semiconductor element, a plurality of vias in the interposer that are bonded to the first plurality of test pads, and a probe pad in the second semiconductor element bonded to a first via of the plurality of vias. In some embodiments, the plurality of test pads includes a two-dimensional array of test pads, and wherein the plurality of vias comprises a two-dimensional array of vias. In some embodiments, the switching circuitry includes a multi-bit switch multiplexer.

In another embodiment, an interposer comprises: a first contact pad on a first side of the interposer; a second contact pad and a third contact pad on a second side of the interposer opposite the first side; and switching circuitry configured to switch between a first electrical connection between the first and second contact pads and a second electrical connection between the first and third contact pads.

In some embodiments, the interposer includes a plurality of contact pads on the second side, the plurality of contact pads including a set of contact pads each connectable to the first contact pad on the first side by way of the switching circuitry, the set of contact pads comprising the second contact pad, the third contact pad, and one or more additional contact pads. In some embodiments, the set of contact pads are disposed within an area no more than 100 $\mu m^2$. In some embodiments, the set of contact pads are disposed within an area no more than 10 $\mu m^2$. In some embodiments, the set of contact pads are disposed within an area no more than 1 $\mu m^2$.

In some embodiments, the bonded structure can include testing circuitry configured to determine a bonding offset between the interposer and one or more semiconductor elements to which the interposer is to be bonded, the testing circuitry configured to transmit a signal to the switching circuitry indicative of the bonding offset. In some embodiments, testing circuitry comprises a plurality of vias in the interposer configured to be bonded to corresponding test pads of the one or more semiconductor elements. In some embodiments, the plurality of vias comprises a two-dimensional array of vias. In some embodiments, the switching circuitry comprises a multi-bit switch multiplexer.

In another embodiment, a method of forming a bonded structure comprises: bonding a first contact pad of a first semiconductor element to a second contact pad on a first side of an interposer; bonding third and fourth contact pads on a second side of the interposer to respective fifth and sixth contact pads of a second semiconductor element; and switching between a first electrical connection between the second and third contact pads and a second electrical connection between the second and fourth contact pads.

In some embodiments, the first semiconductor element includes a first plurality of contact pads including the first contact pad, wherein the second semiconductor element includes a second plurality of contact pads including the fifth and sixth contact pads, wherein the interposer comprises a third plurality of contact pads on the second side, the third plurality of contact pads including a set of contact pads each connectable to the second contact pad on the first side by way of the switching circuitry, the set of contact pads comprising the third contact pad, the fourth contact pad, and one or more additional contact pads. In some embodiments, the method further includes bonding the second semiconductor element to the interposer using a tool that has a misalignment tolerance area, wherein the set of contact pads is disposed within a pad area that is no more than the misalignment tolerance area.

In some embodiments, bonding the first contact pad to the second contact pad includes directly bonding the first contact pad to the second contact pad without an intervening adhesive. In some embodiments, bonding the third and fourth contact pads to the respective fifth and sixth contact pads comprises directly bonding the third and fourth contact pads to the respective fifth and sixth contact pads without an intervening adhesive. In some embodiments, the method can include directly bonding a first nonconductive field region of the first semiconductor element to a second nonconductive field region on the first side of the interposer without an intervening adhesive. In some embodiments, the method can include directly bonding a third nonconductive field region of the second side of the interposer to a fourth nonconductive field region of the second semiconductor element without an intervening adhesive. In some embodiments, the switching circuitry is disposed in the interposer. In some embodiments, the switching circuitry is disposed in at least one of the first and second semiconductor elements.

In another embodiment, a bonded structure comprises: a first semiconductor element having a circuit element, a first contact pad, and a second contact pad; a second semiconductor element having a third contact pad bonded to the first contact pad and a fourth contact pad bonded to the second contact pad; switching circuitry configured to switch between a first electrical connection between the circuit element and the first contact pad and a second electrical connection between the circuit element and the second contact pad; and testing circuitry configured to determine a bonding offset between the first and second semiconductor elements.

In some embodiments, the third pad is directly bonded to the first pad without an intervening adhesive, and wherein the fourth pad is directly bonded to the second pad without an intervening adhesive. In some embodiments, the first semiconductor element comprises a first nonconductive field region in which the first and contact pads are at least partially embedded, the second semiconductor element includes a second nonconductive field region in which the third and fourth contact pads are at least partially embedded, the first and second nonconductive field regions directly bonded to one another without an intervening adhesive. In some embodiments, the testing circuitry is disposed along a dicing lane, the testing circuitry being at least partially destroyed by a dicing step. In some embodiments the switching circuitry is programmed to form the first electrical connection or the second electrical connection based at least in part on the determined bonding offset. In some embodiments, the testing circuitry is configured to transmit a signal to the switching circuitry indicative of the bonding offset.

BRIEF DESCRIPTION OF THE DRAWINGS

FIG. 1A is a schematic cross-sectional side view of two elements prior to direct hybrid bonding.

FIG. 1B is a schematic cross-sectional side view of the two elements shown in FIG. 1A after direct hybrid bonding.

FIG. 3B is a schematic cross-sectional view of a bonded structure including the components of FIG. 3A, according to one embodiment.

FIG. 5A is a schematic side-sectional view of a bonded structure having test circuitry configured to determine a bonding offset between the first and second semiconductor elements and to transmit a signal to the switching circuitry indicative of the bonding offset.

FIG. 5B is a schematic top-sectional view of a bonded structure including the components of FIG. 5A, according to one embodiment.

DETAILED DESCRIPTION

Overview

Figure 2A:
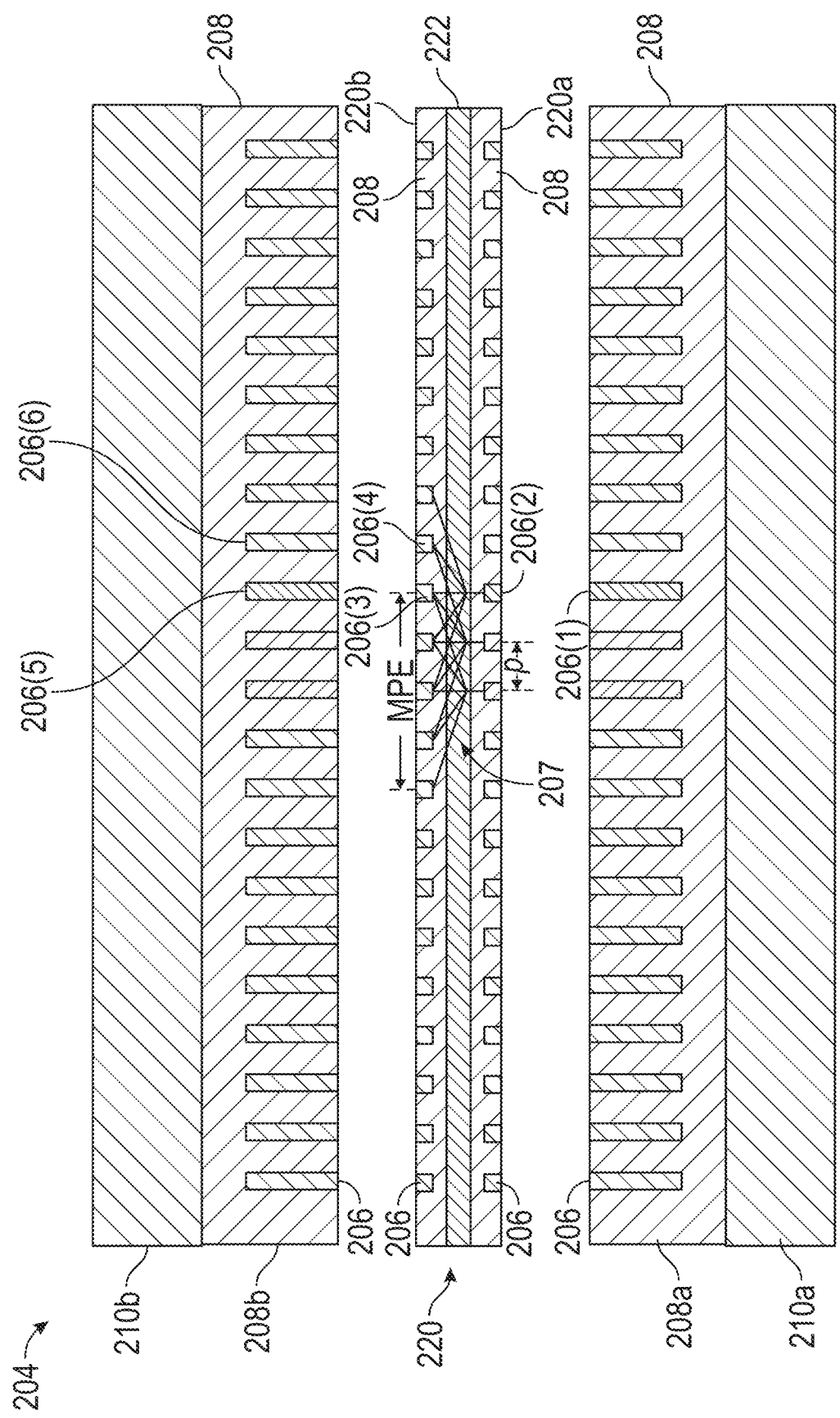
FIG. 2A is a schematic cross-sectional view of a first semiconductor element, an interposer, and a second semiconductor element prior to bonding.

There is a growing demand for directly bonding semiconductor elements having contact pads arranged at a fine pitch, so as to increase interconnect density and provide improved electrical capabilities. However, it can be challenging to accurately align finely-pitched contact pads, since the pick-and-place and/or bonding tools have a misalignment tolerance. If the pitch of the pads to be bonded is less than or approximately the same as the misalignment tolerance, then there is a likelihood that pads on one element will be bonded to the incorrect pads on the opposing element, resulting in reduced electrical performance. Various embodiments disclosed herein compensate for misalignments during bonding by providing switching circuitry that is configured to switch an electrical connection between opposing pads so as to ensure that the pads are correctly connected to one another.

Examples of Direct Bonding Methods and Directly Bonded Structures

Various embodiments disclosed herein relate to directly bonded structures in which two elements can be directly bonded to one another without an intervening adhesive. FIGS. 1A and 1B schematically illustrate a process for forming a directly bonded structure without an intervening adhesive according to some embodiments. In FIGS. 1A and 1B, a bonded structure 100 comprises two elements 102 and 104 that can be directly bonded to one another without an intervening adhesive. Two or more semiconductor elements (such as integrated device dies, wafers, etc.) 102 and 104 may be stacked on or bonded to one another to form the bonded structure 100. Conductive features 106a (e.g., contact pads, exposed ends of vias (e.g., TSVs), or a through substrate electrodes) of a first element 102 may be electrically connected to corresponding conductive features 106b of a second element 104. The conductive features may comprise metallic pads formed in a nonconductive bonding region, and may be connected to underlying metallization, such as a redistribution layer (RDL). Any suitable number of elements can be stacked in the bonded structure 100. For example, a third element (not shown) can be stacked on the second element 104, a fourth element (not shown) can be stacked on the third element, and so forth. Additionally or alternatively, one or more additional elements (not shown) can be stacked laterally adjacent one another along the first element 102. In some embodiments, the laterally stacked additional element may be smaller than the second element. In some embodiments, the laterally stacked additional element may be two times smaller than the second element.

In some embodiments, the elements 102 and 104 are directly bonded to one another without an adhesive. In various embodiments, a non-conductive field region that includes a non-conductive or dielectric material can serve as a first bonding layer 108a of the first element 102 which can be directly bonded to a corresponding non-conductive field region that includes a non-conductive or dielectric material serving as a second bonding layer 108b of the second element 104 without an adhesive. The non-conductive bonding layers 108a and 108b can be disposed on respective front sides 114a and 114b of device portions 110a and 110b, such as a semiconductor (e.g., silicon) portion of the elements 102, 104. Active devices and/or circuitry can be patterned and/or otherwise disposed in or on the device portions 110a and 110b. Active devices and/or circuitry can be disposed at or near the front sides 114a and 114b of the device portions 110a and 110b, and/or at or near opposite backsides 116a and 116b of the device portions 110a and 110b. The non-conductive material can be referred to as a non-conductive bonding region or bonding layer 108a of the first element 102. In some embodiments, the non-conductive bonding layer 108a of the first element 102 can be directly bonded to the corresponding non-conductive bonding layer 108b of the second element 104 using dielectric-to-dielectric bonding techniques. For example, non-conductive or dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. It should be appreciated that in various embodiments, the bonding layers 108a and/or 108b can comprise a non-conductive material such as a dielectric material, such as silicon oxide, or an undoped semiconductor material, such as undoped silicon. Suitable dielectric bonding surface or materials for direct bonding include but are not limited to inorganic dielectrics, such as silicon oxide, silicon nitride, or silicon oxynitride, or can include carbon, such as silicon carbide, silicon oxycarbonitride, low K dielectric materials, SICOH dielectrics, silicon carbonitride or diamond-like carbon or a material comprising of a diamond surface. Such carbon-containing ceramic materials can be considered inorganic, despite the inclusion of carbon. In some embodiments, the dielectric materials do not comprise polymer materials, such as epoxy, resin or molding materials.

In various embodiments, direct hybrid bonds can be formed without an intervening adhesive. For example, non-conductive bonding surfaces 112a and 112b can be polished to a high degree of smoothness. The bonding surfaces 112a and 112b can be cleaned and exposed to a plasma and/or etchants to activate the surfaces 112a and 112b. In some embodiments, the surfaces 112a and 112b can be terminated with a species after activation or during activation (e.g., during the plasma and/or etch processes). Without being limited by theory, in some embodiments, the activation process can be performed to break chemical bonds at the bonding surfaces 112a and 112b, and the termination process can provide additional chemical species at the bonding surfaces 112a and 112b that improves the bonding energy during direct bonding. In some embodiments, the activation and termination are provided in the same step, e.g., a plasma to activate and terminate the surfaces 112a and 112b. In other embodiments, the bonding surfaces 112a and 112b can be terminated in a separate treatment to provide the additional species for direct bonding. In various embodiments, the terminating species can comprise nitrogen. For example, in some embodiments, the bonding surface(s) 112a, 112b can be exposed to a nitrogen-containing plasma. Further, in some embodiments, the bonding surfaces 112a and 112b can be exposed to fluorine. For example, there may be one or multiple fluorine peaks at or near a bonding interface 118 between the first and second elements 102, 104. Thus, in the directly bonded structure 100, the bonding interface 118 between two non-conductive materials (e.g., the bonding layers 108a and 108b) can comprise a very smooth interface with higher nitrogen content and/or fluorine peaks at the bonding interface 118. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive features 106a of the first element 102 can also be directly bonded to corresponding conductive features 106b of the second element 104. For example, a hybrid bonding technique can be used to provide conductor-to-conductor direct bonds along the bond interface 118 that includes covalently direct bonded non-conductive-to-non-conductive (e.g., dielectric-to-dielectric) surfaces, prepared as described above. In various embodiments, the conductor-to-conductor (e.g., conductive feature 106a to conductive feature 106b) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, non-conductive (e.g., dielectric) bonding surfaces 112a, 112b (for example, inorganic dielectric surfaces) can be prepared and directly bonded to one another without an intervening adhesive as explained above. Conductive contact features (e.g., conductive features 106a and 106b which may be at least partially surrounded by non-conductive dielectric field regions within the bonding layers 108a, 108b) may also directly bond to one another without an intervening adhesive. In various embodiments, the conductive features 106a, 106b can comprise discrete pads at least partially embedded in the non-conductive field regions. In some embodiments, the conductive contact features can comprise exposed contact surfaces of through substrate vias (TSVs). In some embodiments, the respective conductive features 106a and 106b can be recessed below exterior (e.g., upper) surfaces (non-conductive bonding surfaces 112a and 112b) of the dielectric field region or non-conductive bonding layers 108a and 108b, for example, recessed by less than 30 nm, less than 20 nm, less than 15 nm, or less than 10 nm, for example, recessed in a range of 2 nm to 20 nm, or in a range of 4 nm to 10 nm. In various embodiments, prior to direct bonding, the recesses in the opposing elements can be sized such that the total gap between opposing contact pads is less than 15 nm, or less than 10 nm. The non-conductive bonding layers 108a and 108b can be directly bonded to one another without an adhesive at room temperature in some embodiments and, subsequently, the bonded structure 100 can be annealed. Upon annealing, the conductive features 106a and 106b can expand and contact one another to form a metal-to-metal direct bond. Beneficially, the use of Direct Bond Interconnect, or DBI®, techniques commercially available from Adeia of San Jose, CA, can enable high density of conductive features 106a and 106b to be connected across the direct bond interface 118 (e.g., small or fine pitches for regular arrays). In some embodiments, the pitch of the conductive features 106a and 106b, such as conductive traces embedded in the bonding surface of one of the bonded elements, may be less than 40 microns or less than 10 microns or even less than 2 microns. For some applications, the ratio of the pitch of the conductive features 106a and 106b to one of the dimensions (e.g., a diameter) of the bonding pad is less than 5, or less than 3 and sometimes desirably less than 2. In other applications, the width of the conductive traces embedded in the bonding surface of one of the bonded elements may range between 0.3 to 20 microns, e.g., in a range of 0.3 to 3 microns. In various embodiments, the conductive features 106a and 106b and/or traces can comprise copper, although other metals may be suitable.

Thus, in direct bonding processes, a first element 102 can be directly bonded to a second element 104 without an intervening adhesive. In some arrangements, the first element 102 can comprise a singulated element, such as a singulated integrated device die. In other arrangements, as shown in FIGS. 1A and 1B, the first element 102 can comprise a carrier or substrate (e.g., a wafer) that includes a plurality (e.g., tens, hundreds, or more) of device regions that, when singulated, form a plurality of integrated device dies. Similarly, the second element 104 can comprise a singulated element, such as a singulated integrated device die, as shown in FIGS. 1A and 1B. In other arrangements, the second element 104 can comprise a carrier or substrate (e.g., a wafer). The embodiments disclosed herein can accordingly apply to wafer-to-wafer, die-to-die, or die-to-wafer bonding processes. In wafer-to-wafer (W2W) processes, two or more wafers can be directly bonded to one another (e.g., direct hybrid bonded) and singulated using a suitable singulation process. After singulation, side edges of the singulated structure (e.g., the side edges of the two bonded elements) may be substantially flush and may include markings indicative of the singulation process (e.g., saw markings if a saw singulation process is used).

As explained herein, the first and second elements 102 and 104 can be directly bonded to one another without an adhesive, which is different from a deposition process. In one application, a width of the first element 102 in the bonded structure is similar to a width of the second element 104. In some other embodiments, a width of the first element 102 in the bonded structure 100 is different from a width of the second element 104. Similarly, the width or area of the larger element in the bonded structure may be at least 10% larger than the width or area of the smaller element. The first and second elements 102 and 104 can accordingly comprise non-deposited elements. Further, directly bonded structures 100, unlike deposited layers, can include a defect region along the bond interface 118 in which nanometer-scale voids (nanovoids) are present. The nanovoids may be formed due to activation of the bonding surfaces 112a and 112b (e.g., exposure to a plasma). As explained above, the bond interface 118 can include concentration of materials from the activation and/or last chemical treatment processes. For example, in embodiments that utilize a nitrogen plasma for activation, a nitrogen peak can be formed at the bond interface 118. The nitrogen peak can be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolized (OH-terminated) surface with $NH_2$ molecules, yielding a nitrogen-terminated surface. In embodiments that utilize an oxygen plasma for activation, an oxygen peak can be formed at the bond interface 118. In some embodiments, the bond interface 118 can comprise silicon oxynitride, silicon oxycarbonitride, or silicon carbonitride. As explained herein, the direct bond can comprise a covalent bond, which is stronger than van Der Waals bonds. The bonding layers 108a and 108b can also comprise polished surfaces that are planarized to a high degree of smoothness.

In various embodiments, the metal-to-metal bonds between the contact pads 106a and 106b can be joined such that copper grains grow into each other across the bond interface 118. In some embodiments, the copper can have grains oriented along the 111 crystal plane for improved copper diffusion across the bond interface 118. The bond interface 118 can extend substantially entirely to at least a portion of the bonded conductive features 106a and 106b, such that there is substantially no gap between the non-conductive bonding layers 108a and 108b at or near the bonded conductive features 106a and 106b. In some embodiments, a barrier layer may be provided under the conductive features 106a and 106b (e.g., which may include copper). In other embodiments, however, there may be no barrier layer under the conductive features 106a and 106b, for example, as described in U.S. Pat. No. 11,195,748, which is incorporated by reference herein in its entirety and for all purposes.

Beneficially, the use of the hybrid bonding techniques described herein can enable extremely fine pitch between adjacent contact pads 106a and 106b, and/or small pad sizes. For example, in various embodiments, the pitch p (i.e., the distance from edge-to-edge or center-to-center, as shown in FIG. 1A) between adjacent conductive features 106a (or 106b) can be in a range of 0.5 microns to 50 microns, in a range of 0.75 microns to 25 microns, in a range of 1 micron to 25 microns, in a range of 1 micron to 10 microns, or in a range of 1 micron to 5 microns. Further, a major lateral dimension (e.g., a pad diameter) can be small as well, e.g., in a range of 0.25 microns to 30 microns, in a range of 0.25 microns to 5 microns, or in a range of 0.5 microns to 5 microns.

Example Embodiments of Bonded Structures

FIG. 2A illustrates a first semiconductor element 202 having a first bonding layer 208a on a device portion 210a, an interposer 220, and a second semiconductor element 204 having a second bonding layer 208b on a device portion 210b prior to bonding. The device portions 210a, 210b can comprise a semiconductor material patterned with one or more devices (e.g., one or more active devices, such as transistors, and/or one or more passive devices). In the following figures, the device portion 210a, 210b of the first and second semiconductor elements 202, 204 are omitted for ease of illustration. Active switching circuitry 222 can be provided in the interposer 220. The switching circuitry 222 can include active circuitry including one or multiple transistors, and can comprise any suitable type of switch, such as a multi-bit switch multiplexer, a multi-bit bus switch, etc. Each of the first semiconductor element 202, the interposer 220, and the second semiconductor element 204 can have corresponding conductive contact pads 206 configured to provide an electrical connection to another element. The contact pads 206 can comprise discrete conductive pads disposed in a nonconductive field region 208 (e.g., a nonconductive bonding layer). In other embodiments, the contact pads 206 can comprise ends of through substrate vias (TSVs) configured to connect to another element. In FIG. 2A, contact pads on the first semiconductor element 202, a first side of the interposer 220a, a second side of the interposer 220b, and the second semiconductor element 204 can have respective pitches p that match, e.g., that are approximately the same. As explained above, the pick-and-place or bonding tools may have a maximum placement error (MPE) that spans a misalignment tolerance area of the elements. Without adequate compensation, using the pick-and-place or bonding tools to align opposing contact pads may result in the incorrect connection of opposing pads. To provide a solution for potential placement error, potential connections 207 can be included to extend along the misalignment tolerance area which can allow for an electrical connection and/or signals to be formed between the proper conductive pads. In some instances, the contact pad pitch can be smaller than the maximum placement error of the pick-and-place or bonding tool.

Figure 2B:
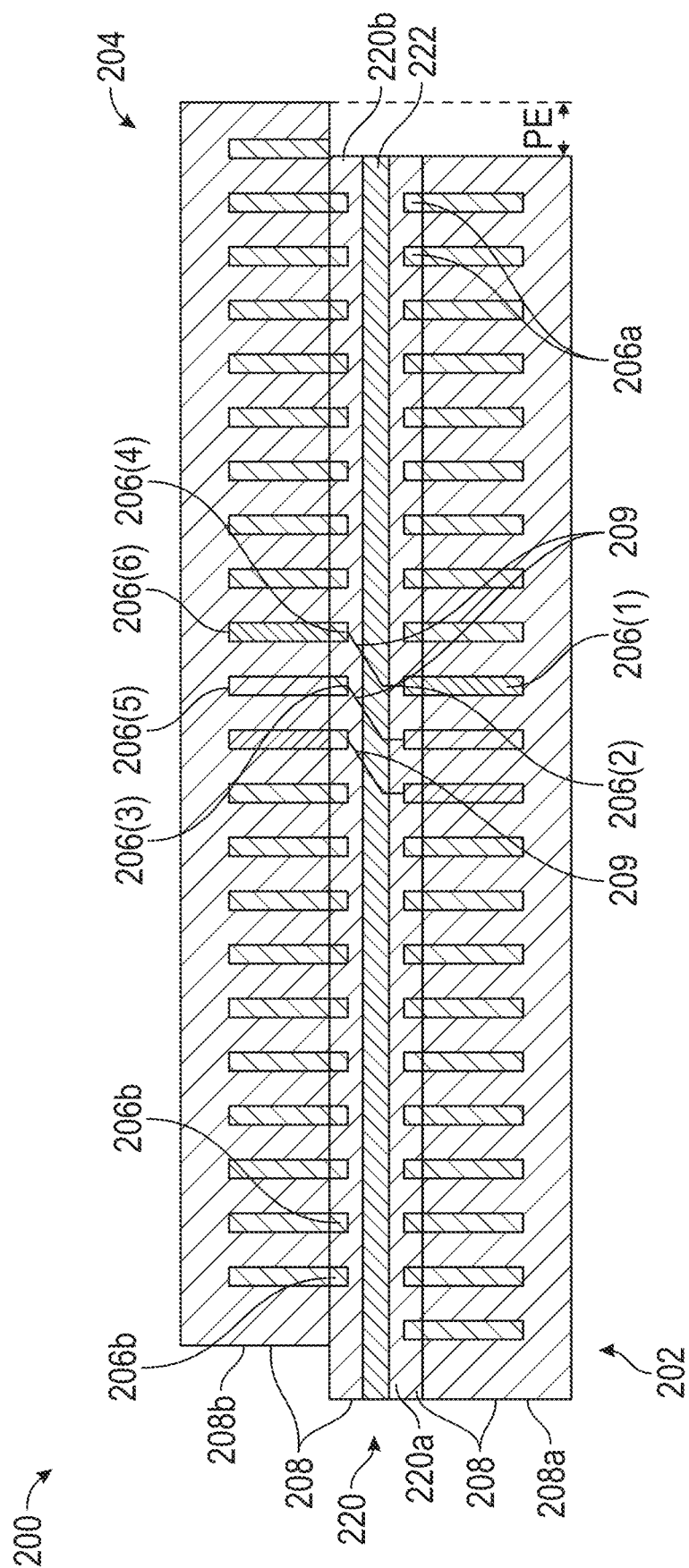
FIG. 2B is a schematic cross-sectional view of a bonded structure including the components of FIG. 2A, according to one embodiment.

FIG. 2B shows a bonded structure 200, according to one embodiment in which the second semiconductor element 204 is offset from the from the first semiconductor element 201 and the interposer 220 by a placement error (PE). As shown in FIG. 2B, the interposer 220 can have a first plurality of contact pads 206a on a first side of the interposer 220a and a second plurality of contact pads 206b on a second side of the interposer 220b opposite the first side. The first side of the interposer 220a can be bonded (e.g., directly bonded without an intervening adhesive) to the first semiconductor element 202, with the first plurality of contact pads 206a electrically connected to the first semiconductor element 202. The second semiconductor element 204 can be bonded (e.g., directly bonded without an intervening adhesive) to the second side of the interposer 220b, with the second plurality of contact pads 206b electrically connected to the second semiconductor element 204. The switching circuitry 222 can be configured to switch electrical connections between each contact pad of the first plurality of contact pads 206a and a set of multiple contact pads of the second plurality of contact pads 206b. In some embodiments, the switching may be permanent or irreversible, such that, once the switching circuitry has switched electrical connections, the connection may not be reversed or switched to another pad (e.g., the switch may comprise a fuse or antifuse). In other embodiments, the switching may be reversible, such that the switch can reverse or change electrical connection between the pads after making the initial switch. For example, in such embodiments, the reversible switching may be programmable such that active circuitry can switch between or among a plurality of states or pads.

For example, as shown in FIG. 2B, the first semiconductor element 202 can have a first contact pad 206(1), and the interposer can have a second contact pad 206(2) on the first side of the interposer 220. The second contact pad 206(2) can be bonded (e.g., directly bonded without an intervening adhesive) to the first contact pad 206(1). The interposer 220 can have a third contact pad 206(3) and a fourth contact pad 206(4) on the second side 220b of the interposer opposite the first side 220a. The second semiconductor element 204 can have a fifth contact pad 206(5) bonded (e.g., directly bonded without an intervening adhesive) to the third contact pad 206(3) and a sixth contact pad 206(6) bonded (e.g., directly bonded without an intervening adhesive) to the fourth contact pad 206(4). The switching circuitry 222 can be configured to switch between a first electrical connection between the second and third contact pads 206(2), 206(3) and a second electrical connection between the second and fourth contact pads 206(2), 206(4) to provide an established connection 209. As shown, the second and fourth pads 206(2), 206(4) can be laterally offset from one another. Thus, electrical connections and/or signals are connected one-to-one such that each electrical connection can only be between one set of contact pads. Additionally, power and/or ground need not be reconfigured after the first semiconductor element, second semiconductor element, and interposer are bonded.

In FIGS. 2A and 2B, the second contact pad 206(2) can be connectable to the set of multiple contact pads including the third and fourth pads 206(3), 206(4) and one or more additional contact pads. In various embodiments, the set of multiple contact pads that are connectable to the second pad 206(2) can be disposed within a pad area that is no more than the misalignment tolerance area M. In various embodiments, the set of contact pads can be disposed within a pad area of no more than 100 $\mu m^2$, within a pad area of no more than 25 $\mu m^2$, within a pad area of no more than 10 $\mu m^2$, within a pad area of no more than 5 $\mu m^2$, or within a pad area of no more than 1 $\mu m^2$. Beneficially, therefore, the set of multiple pads that are connectable to the second pad 206(2) can be within the misalignment tolerance of the bonding tool such that the second pad 206(2) is bonded to one of the pads in the set (and not to a pad that is not in the set).

Figure 3A:
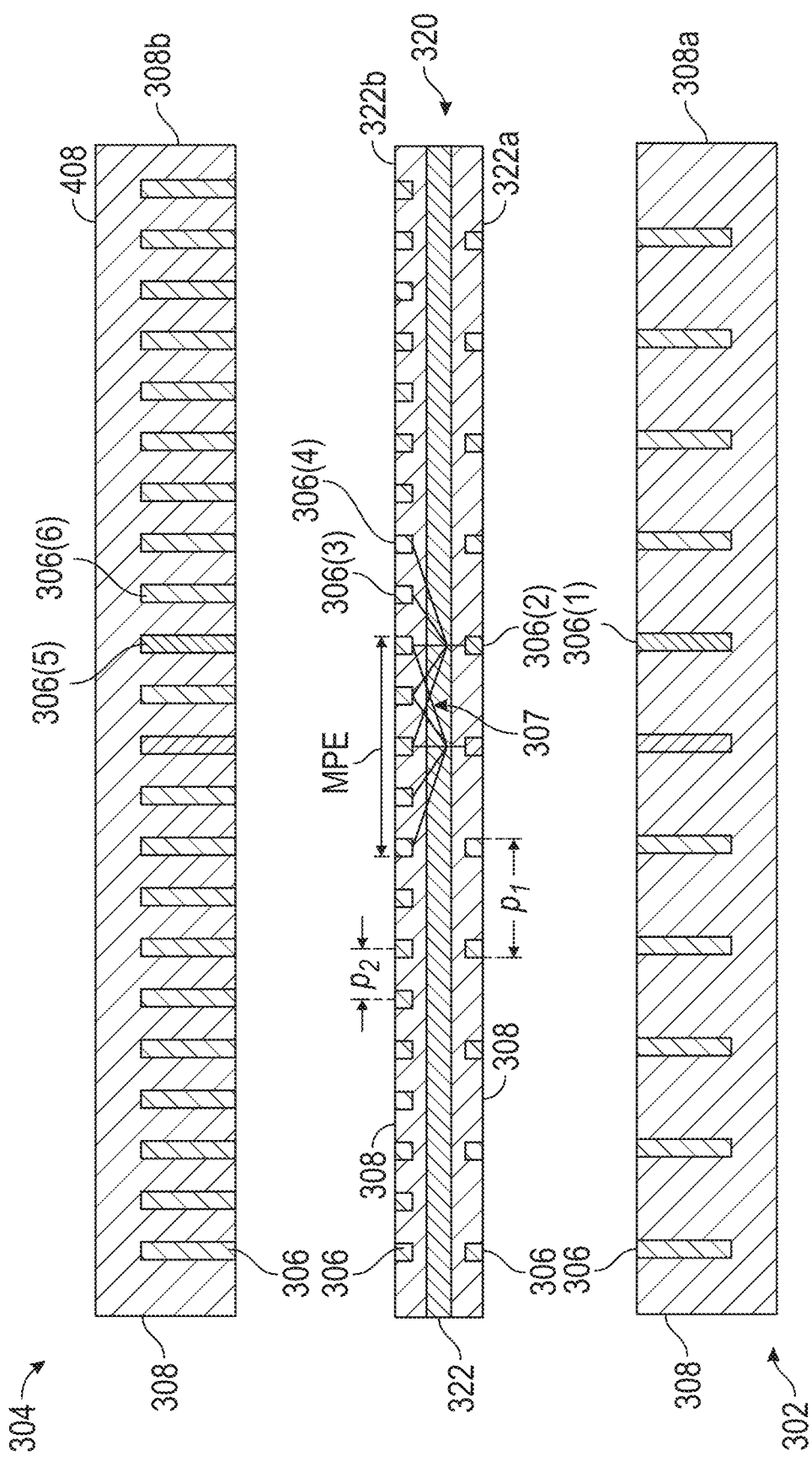
FIG. 3A is another embodiment of a first semiconductor element, an interposer, and a second semiconductor element prior to bonding, according to an embodiment.

FIGS. 3A-3B are generally similar to the embodiment of FIGS. 2A-2B. Unlike the embodiment of FIGS. 2A-2B, however, the interposer 320 can be configured to connect semiconductor elements having different pitches, $p_1$, $p_2$. For example, the pads of the first semiconductor element 302 can have a larger pitch than the pads of the second semiconductor element 304. The pads on the first side of the interposer 320a can have the larger pitch to match the pads of the first semiconductor element 302, and the pads on the second side of the interposer 320b can have the smaller pitch to match with pads of the second element. Beneficially, the embodiment of FIGS. 3A-3B can enable the connection of semiconductor elements 302, 304 having different pitches.

Figure 4A:
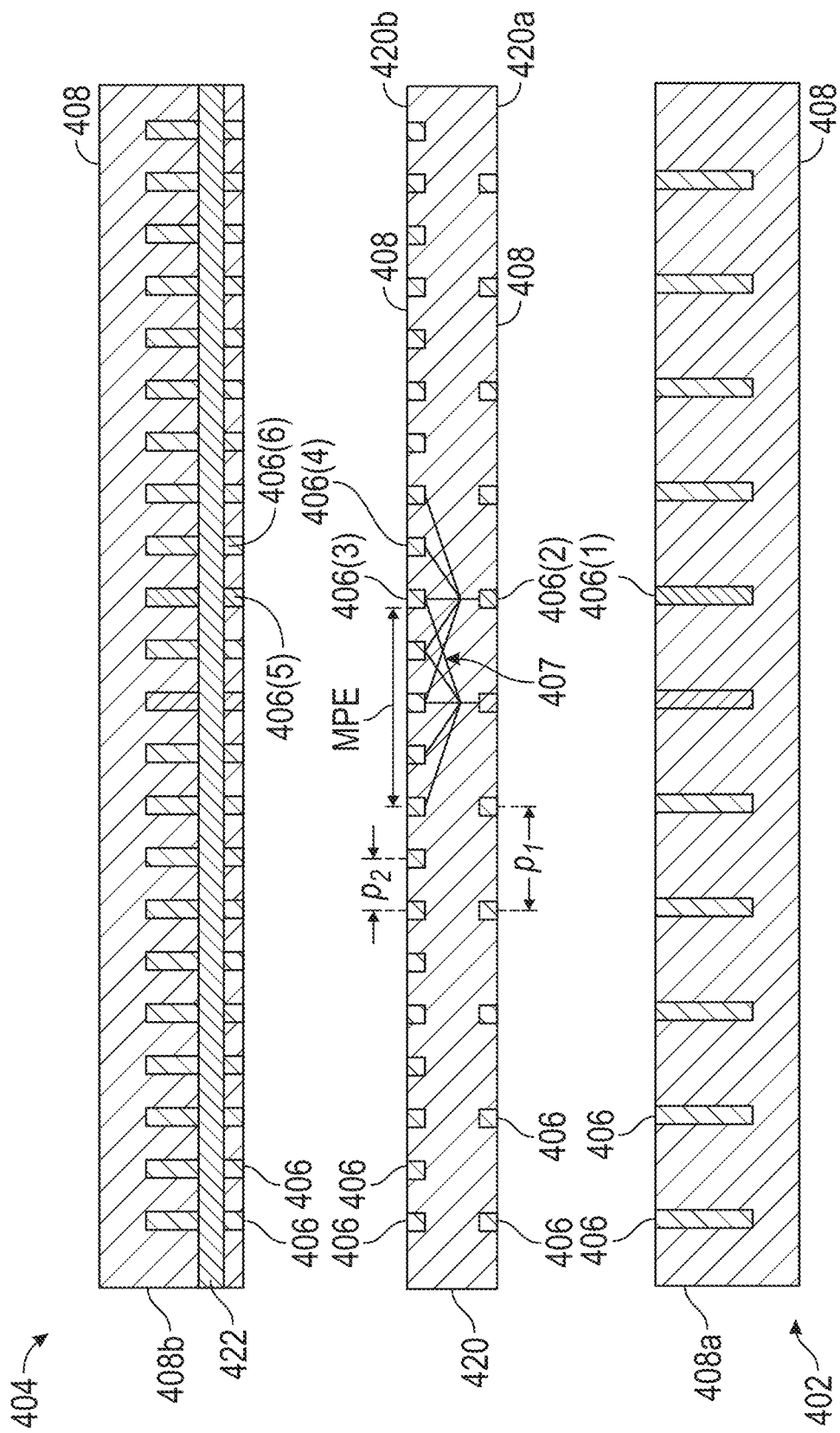
FIG. 4A is a schematic cross-sectional view of a first semiconductor element, an interposer, and a second semiconductor element prior to bonding, according to another embodiment.
Figure 4B:
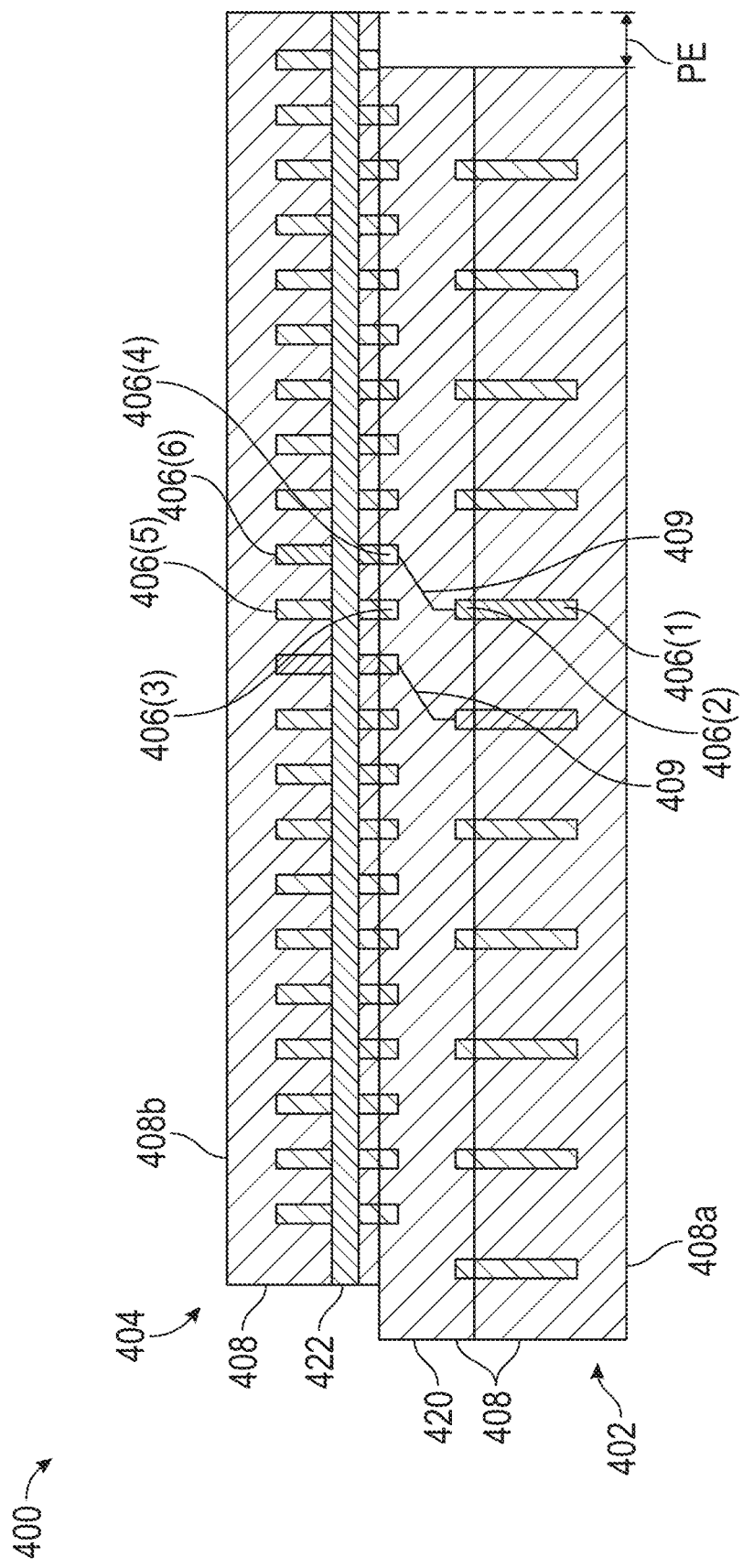
FIG. 4B is a schematic cross-sectional view of a bonded structure including the components of FIG. 4A, according to one embodiment.

FIGS. 4A-4B are generally similar to the embodiments of FIGS. 2A-3B. Unlike the embodiments of FIGS. 2A-3B, however, in which the active switching circuitry is disposed in the interposer, in FIGS. 4A-4B, the active switching circuitry 422 can be disposed in at least one of the first and second semiconductor elements 402, 404. In FIGS. 4A-4B, for example, the switching circuitry 422 can be disposed in the second semiconductor element 404. In other embodiments, the switching circuitry 422 can additionally or alternatively be disposed in the first semiconductor element 402. It should be appreciated that, although FIGS. 2A-4B show a one-to-many connection between the pads of the first semiconductor element to pads of the second semiconductor element, in various embodiments, there may additionally or alternatively be a one-to-many connection between the pads of the second semiconductor element and pads of the first semiconductor element.

FIGS. 5A-5B illustrate test circuitry 550 configured to determine a bonding offset between the first and second semiconductor elements 502, 504 and to transmit a signal to the switching circuitry 522 indicative of the bonding offset of a bonded structure 500. The testing circuitry 550 can comprise a plurality of test pads 526 in the first semiconductor element 502, a plurality of vias 524 in the interposer 520 that are bonded to the first plurality of test pads 526, and a probe pad 528 in the second semiconductor element 504 bonded to a first via of the plurality of vias 524. The testing circuitry 550 further comprises a reference pad 530 connected to the probe pad 528. The testing circuitry 550 can be configured to monitor continuity of a signal between the probe pad 528 and the reference pad 530 to determine the test pad 526 to which the probe pad 528 is connected. As shown in FIGS. 5A-5B, the bonding offset due to misalignment can be determined at least in part on which test pad and via the probe pad connects to. In FIG. 5A, for example, the probe pad 528 bonds to the test pad 526 and via that are offset one place (+1) relative to accurate alignment (0). In some embodiments, the testing circuitry 550 can be electrically connected to the active circuitry 522 and can send the signal to the active circuitry, which can switch electrical connections to the opposing pad positioned in the +1 position. In other embodiments, the testing circuitry 550 may not be electrically connected to the active circuitry 522. Instead, in such embodiments, the switching circuitry 522 can be programmed to form the first electrical connection or the second electrical connection based at least in part on the determined bonding offset.

Figure 5C:
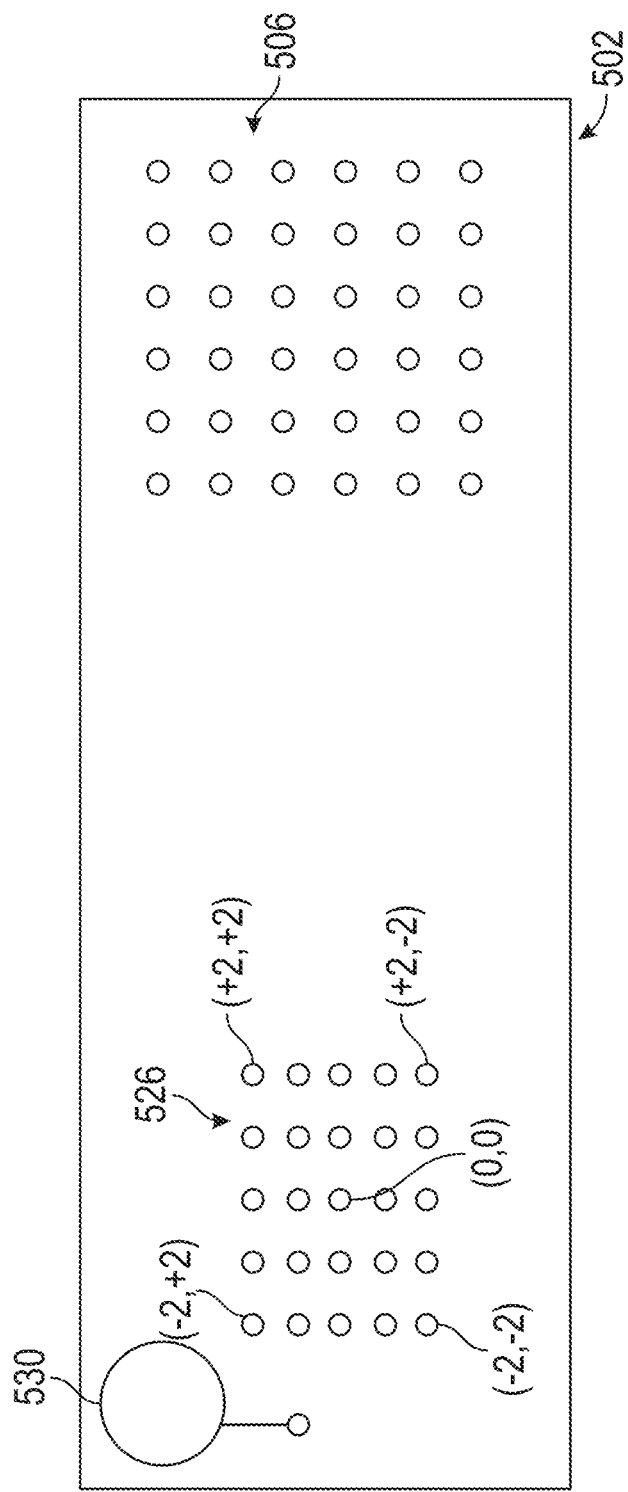
FIG. 5C is a schematic top-sectional view of a semiconductor element including test pads and vias disposed in a two-dimensional (2D) array so as to accommodate 2D misalignments.

As shown in FIG. 5C, in various embodiments, the test pads 526 and vias 524 can be disposed in a two-dimensional (2D) array so as to accommodate 2D misalignments. In FIG. 5C, therefore, the test pads 526 and vias 524 can be disposed at bond offsets in two dimensions denoted by (x,y) coordinates. The test pads can be disposed at any suitable location of the first semiconductor element. For example, in various embodiments, the test pads can be disposed in the dicing lanes, along edges of the wafer, or within the footprint of the singulated die. In some embodiments, therefore, the testing circuitry may be damaged during the dicing process.

Figure 6:
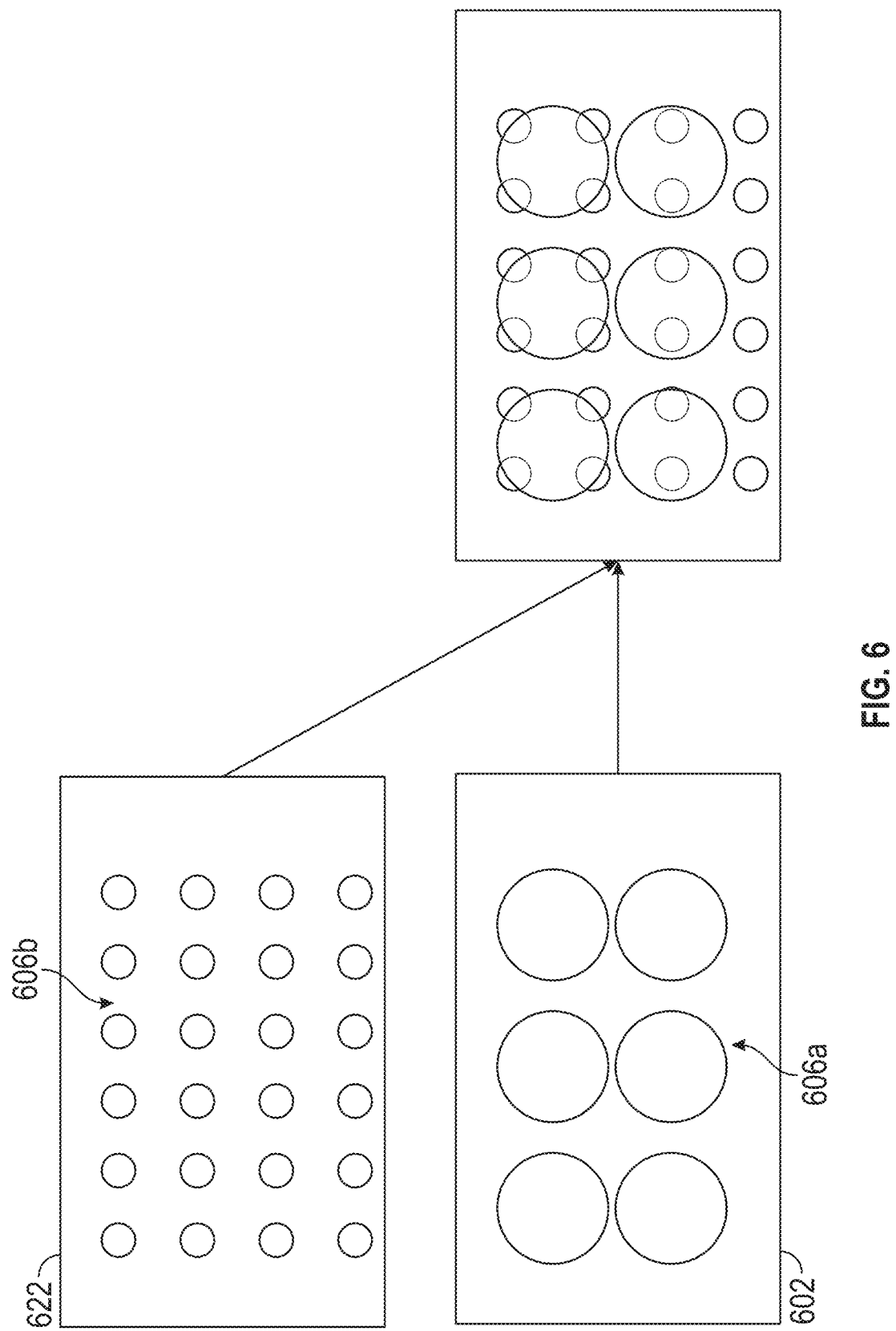
FIG. 6 is a schematic top-sectional view of opposing contact pads of different diameters to improve placement accuracy.

Turning to FIG. 6, in some embodiments, to improve placement accuracy, the diameter of opposing contact pads can be different. For example, the pads 606a on the first semiconductor element 602 can be smaller than the pads 606b on the interposer 620, or vice versa. The larger pad can be at least equal to or larger than the set of pads on the opposing side, which can ensure that at least some of the smaller pads contact and electrically connect to the larger opposing pad, improving placement yield.

Figure 7:
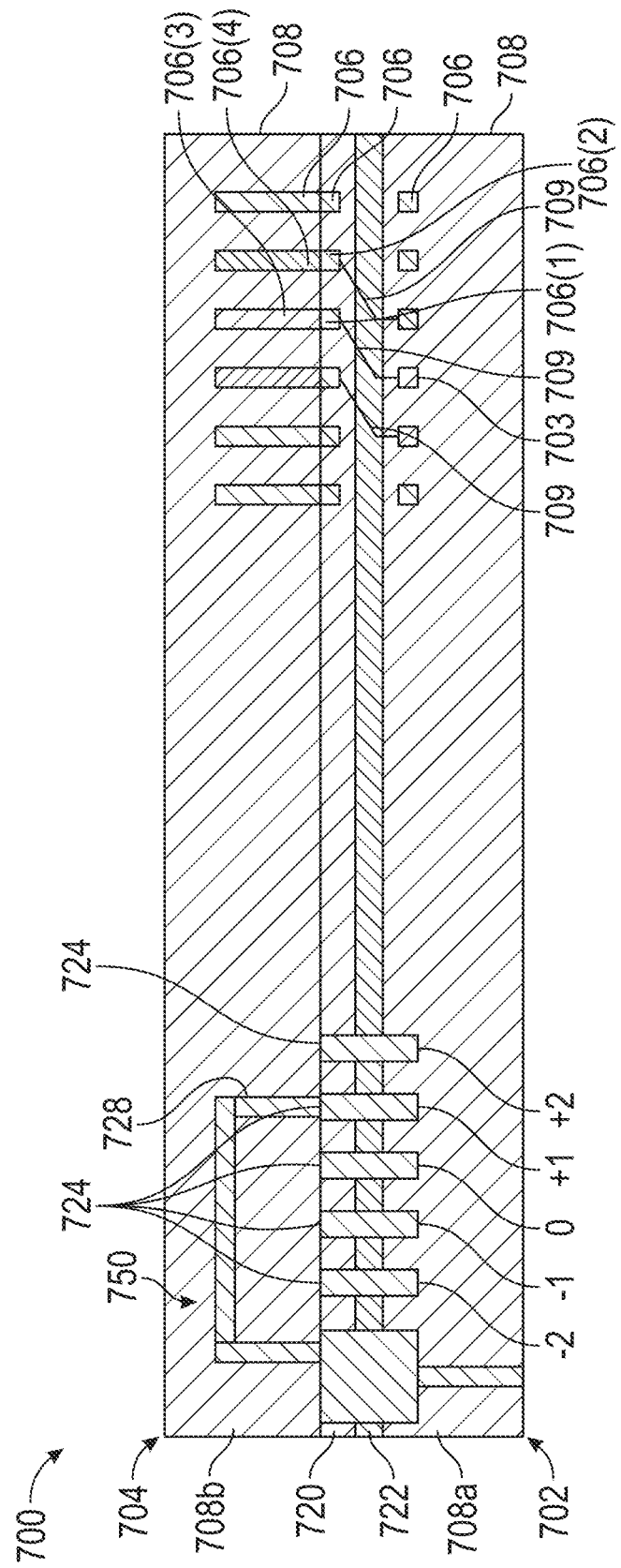
FIG. 7 is a schematic side-sectional view of a bonded structure having a circuit element.

FIG. 7 illustrates another embodiment of a bonded structure 700. In FIG. 7, the bonded structure 700 includes a first semiconductor element 702 having a circuit element 703, a first contact pad 706(1), and a second contact pad 706(2). The circuit element 703 can comprise at least a portion of an active circuit, a trace connected to an active circuit, or other signal-carrying circuitry. The bonded structure 700 can include a second semiconductor element 704 having a third contact pad 706(3) bonded to the first contact pad 706(1) and a fourth contact pad 706(4) bonded to the second contact pad 706(2). In some embodiments, as explained herein, the first and second semiconductor elements 702, 704 can be direct hybrid bonded to one another. The bonded structure 700 can comprise switching circuitry 722 configured to switch between a first electrical connection between the circuit element 703 and the first contact pad 706(1) and between the circuit element 703 and the second contact pad 706(2). As in FIGS. 5A-5C, testing circuitry 750 can be configured to determine a bonding offset between the first and second semiconductor 702, 704 elements and to transmit a signal to the switching circuitry 722 indicative of the bonding offset. As explained above, the testing circuitry 750 can be disposed at any suitable location within the elements.

Thus, in the embodiment of FIG. 7, the bonded structure 700 may not include an intervening interposer between the first and second semiconductor elements 702, 704. Rather, the first and second semiconductor elements 702, 704 can be bonded directly to one another. The switching circuitry 722 can be disposed entirely within the first semiconductor element 702 in some embodiments (or, alternatively, entirely within the second semiconductor element). In other embodiments, the switching circuitry 720 can span across the bond interface such that a first portion of the switching circuitry 722 is disposed in the first semiconductor element 702 and a second portion of the switching circuitry 722 is disposed in the second semiconductor element 704.

Terminology

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure.

For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bonded structure comprising:
   a first semiconductor element having a first contact pad;
   an interposer having a second contact pad on a first side of the interposer and a third contact pad and a fourth contact pad on a second side of the interposer opposite the first side, the second contact pad bonded to the first contact pad;
   a second semiconductor element having a fifth contact pad bonded to the third contact pad and a sixth contact pad bonded to the fourth contact pad, wherein the second side of the interposer and the second semiconductor element are hybrid bonded to one another without an intervening adhesive; and
   switching circuitry configured to switch between a first electrical connection between the second and third contact pads and a second electrical connection between the second and fourth contact pads.

2. The bonded structure of claim 1, wherein the switching circuitry is disposed in the interposer.

3. The bonded structure of claim 1, wherein the switching circuitry is disposed in at least one of the first semiconductor element and the second semiconductor element.

4. The bonded structure of claim 1, wherein the first semiconductor element comprises a first plurality of contact pads including the first contact pad, and wherein the second semiconductor element comprises a second plurality of contact pads including the fifth and sixth contact pads, the first plurality of contact pads having a first pitch that matches a second pitch of the second plurality of contact pads.

5. The bonded structure of claim 1, wherein the first semiconductor element comprises a first plurality of contact pads including the first contact pad, and wherein the second semiconductor element comprises a second plurality of contact pads including the fifth and sixth contact pads, the first plurality of contact pads having a first pitch that is different from a second pitch of the second plurality of contact pads.

6. The bonded structure of claim 1, wherein the interposer comprises a third plurality of contact pads on the second side, the third plurality of contact pads including a set of contact pads each connectable to the second contact pad on the first side by way of the switching circuitry, the set of contact pads comprising the third contact pad, the fourth contact pad, and one or more additional contact pads.

7. The bonded structure of claim 6, wherein the set of contact pads are disposed within an area no more than 100 µm².

8. The bonded structure of claim 1, further comprising testing circuitry configured to determine a bonding offset between the first and second semiconductor elements.

9. The bonded structure of claim 8, wherein the testing circuitry is configured to transmit a signal to the switching circuitry indicative of the bonding offset.

10. The bonded structure of claim 8, wherein the switching circuitry is programmed to form the first electrical connection or the second electrical connection based at least in part on the determined bonding offset.

11. The bonded structure of claim 9, wherein the testing circuitry further comprises a reference pad connected to a probe pad, the signal transmitted to the switching circuitry based at least in part on a determining a continuity of the signal between the probe pad and the reference pad.

12. The bonded structure of claim 1, wherein the second contact pad is directly bonded to the first contact pad without an intervening adhesive.

13. The bonded structure of claim 12, wherein the first semiconductor element comprises a first nonconductive field region in which the first contact pad is at least partially embedded, wherein the first side of the interposer includes a second nonconductive field region in which the second contact pad is at least partially embedded, the first and second nonconductive field regions directly bonded to one another without an intervening adhesive.

14. The bonded structure of claim 1, wherein the switching circuitry comprises a multi-bit switch multiplexer.

15. The bonded structure of claim 1, wherein the switching circuitry is configured to switch between electrically connecting the second and fifth contact pads and electrically connecting the second and sixth contact pads.

16. A bonded structure comprising:
    a first semiconductor element;
    an interposer having a first plurality of contact pads on a first side of the interposer and a second plurality of contact pads on a second side of the interposer opposite the first side, the first side of the interposer bonded to the first semiconductor element, the first plurality of contact pads electrically connected to the first semiconductor element;
    a second semiconductor element bonded to the second side of the interposer, the second plurality of contact pads electrically connected to the second semiconductor element; and
    switching circuitry configured to switch electrical connections between each contact pad of the first plurality of contact pads and a set of multiple contact pads of the second plurality of contact pads.

17. The bonded structure of claim 16, wherein the switching circuitry is configured to switch electrical connections between each contact pad of the second plurality of contact pads and a second set of multiple contact pads of the first plurality of contact pads.

18. The bonded structure of claim 16, wherein the switching circuitry is disposed in the interposer.

19. The bonded structure of claim 16, wherein the switching circuitry is disposed in at least one of the first semiconductor element and the second semiconductor element.

20. The bonded structure of claim 16, wherein the first semiconductor element includes a third plurality of contact pads directly bonded to the first plurality of contact pads without an intervening adhesive, and wherein the second semiconductor element includes a fourth plurality of contact pads directly bonded to the second plurality of contact pads without and intervening adhesive.

21. The bonded structure of claim 20, wherein the switching circuitry is configured to switch electrical connections between each contact pad of the first plurality of contact pads and a set of multiple contact pads of the fourth plurality of contact pads.

22. The bonded structure of claim 20, wherein the first semiconductor element includes a first nonconductive field region in which the third plurality of contact pads are at least partially disposed, wherein the first side of the interposer includes a second nonconductive field region in which the first plurality of contact pads are at least partially disposed, and wherein the first and second nonconductive field regions are directly bonded without an adhesive.

23. The bonded structure of claim 20, wherein the second side of the interposer includes a third nonconductive field region in which the second plurality of contact pads are at least partially disposed, wherein the second semiconductor element includes a fourth nonconductive field region in which the fourth plurality of contact pads are at least partially disposed, and wherein the third and fourth nonconductive field regions are directly bonded without an adhesive.

24. A bonded structure comprising:
   a first semiconductor element having a circuit element, a first contact pad, and a second contact pad;
   a second semiconductor element having a third contact pad bonded to the first contact pad and a fourth contact pad bonded to the second contact pad;
   switching circuitry configured to switch between a first electrical connection between the circuit element and the first contact pad and a second electrical connection between the circuit element and the second contact pad; and
   testing circuitry configured to determine a bonding offset between the first and second semiconductor elements.

25. The bonded structure of claim 24, wherein the third contact pad is directly bonded to the first contact pad without an intervening adhesive, and wherein the fourth contact pad is directly bonded to the second contact pad without an intervening adhesive.

26. The bonded structure of claim 25, wherein the first semiconductor element comprises a first nonconductive field region in which the first and second contact pads are at least partially embedded, wherein the second semiconductor element includes a second nonconductive field region in which the third and fourth contact pads are at least partially embedded, the first and second nonconductive field regions directly bonded to one another without an intervening adhesive.

27. The bonded structure of claim 25, wherein the testing circuitry is disposed along a dicing lane, the testing circuitry being at least partially destroyed by a dicing step.

28. The bonded structure of claim 24, wherein the switching circuitry is programmed to form the first electrical connection or the second electrical connection based at least in part on the determined bonding offset.

29. The bonded structure of claim 24, wherein the testing circuitry is configured to transmit a signal to the switching circuitry indicative of the bonding offset.

* * * * *